US00RE35537E

United States Patent [19]

Shimaoka et al.

[11] E Patent Number: Re. 35,537

[45] Reissued Date of Patent: Jun. 17, 1997

[54] METHOD AND APPARATUS FOR FORMING COLOR PROOF

[75] Inventors: Hitoshi Shimaoka, Kumamoto; Shigeru Mizuo, Tokyo; Akira Akashi, Tokyo; Miyuki Hosoi, Tokyo, all of Japan

[73] Assignee: Konica Corporation, Tokyo, Japan

[21] Appl. No.: 400,266

[22] Filed: Mar. 3, 1995

Related U.S. Patent Documents

Reissue of:

[64] Patent No.: 5,019,484
Issued: May 28, 1991
Appl. No.: 285,937
Filed: Dec. 19, 1988

U.S. Applications:

[63] Continuation of Ser. No. 64,927, May 24, 1993, abandoned.

[30] Foreign Application Priority Data

| | | | |
|---|---|---|---|
| Dec. 18, 1987 | [JP] | Japan | 62-320699 |
| Dec. 21, 1987 | [JP] | Japan | 62-324347 |
| Jan. 30, 1988 | [JP] | Japan | 63-20351 |

[51] Int. Cl.[6] ..... G03C 7/00

[52] U.S. Cl. ..... 430/293; 430/394; 430/952; 355/88; 355/132

[58] Field of Search ..... 430/293, 358, 430/365, 394, 952; 355/88, 132, 91, 94

[56] References Cited

U.S. PATENT DOCUMENTS

| | | | |
|---|---|---|---|
| 3,649,268 | 3/1972 | Chu | 430/291 |
| 3,741,649 | 6/1973 | Podesta et al. | 355/88 |
| 3,798,034 | 3/1974 | Laridon | 430/143 |
| 3,854,950 | 12/1974 | Held | 430/300 |
| 4,174,216 | 11/1979 | Cohen | 430/257 |
| 4,195,995 | 4/1980 | Hoehn | 430/142 |
| 4,292,394 | 9/1981 | Chu et al. | 430/293 |
| 4,360,266 | 11/1982 | Takeuchi | 355/132 |
| 4,425,417 | 1/1984 | Ingalls et al. | 430/30 |
| 4,522,903 | 6/1985 | Heiart et al. | 430/22 |
| 4,553,835 | 11/1985 | Morgan, Jr. | 355/77 |
| 4,656,107 | 4/1987 | Moscony et al. | 430/5 |
| 4,737,436 | 4/1988 | Thompson | 430/143 |
| 4,816,378 | 3/1989 | Powers et al. | 430/301 |
| 4,842,916 | 6/1989 | Sanders et al. | 430/333 |
| 4,854,383 | 8/1989 | Lin et al. | 355/132 |
| 4,870,455 | 9/1989 | Morgan, Jr. | 355/32 |

FOREIGN PATENT DOCUMENTS

| | | |
|---|---|---|
| 56-51732 | 5/1981 | Japan . |
| 1 578 099 | 10/1980 | United Kingdom . |

*Primary Examiner*—George F. Lesmes
*Assistant Examiner*—Laura Weiner
*Attorney, Agent, or Firm*—Finnegan, Henderson, Farabow, Garrett & Dunner, L.L.P.

[57] ABSTRACT

A color proof formation method includes the steps of bringing a first color separated film original mounted upon an original mounting table into tight contact with a photosensitive material fixed upon a mounting table, and exposing the film original; separating the photosensitive material mounting table from the original mounting table; replacing or exchanging the first film original upon the original mounting table with a second color separated film original; and bringing the second film original into tight contact with the photosensitive material. The steps are repeatedly performed a predetermined number of times so as to form a color proof. There is also disclosed a color proof formation apparatus including a suction unit for forming a suction groove, for bringing the film original and the photosensitive material into tight engagement with each other, between the film original mounting table and the photosensitive material mounting table while the film original mounting table and the photosensitive material mounting table are close to or in contact with each so that the film original and the photosensitive material are brought into surface contact with each other, and for evacuating the air interposed between the film original and the photosensitive material so that the film original and the photosensitive material are in fact brought into tight contact with each other.

20 Claims, 4 Drawing Sheets

METHOD AND APPARATUS FOR FORMING COLOR PROOF

Matter enclosed in heavy brackets [ ] appears in the original patent but forms no part of this reissue specification; matter printed in italics indicates the additions made by reissue.

*This application is a continuation of application Ser. No. 08/064,927, filed May 24, 1993, now abandoned, which is a Reissue application of U.S. patent application Ser. No. 07/285,937, filed Dec. 19, 1988, now U.S. Pat. No. 5,019,484.*

FIELD OF THE INVENTION

The present invention relates to color proof formation apparatus within which halftone film originals, each having a separate color, are accurately placed at a predetermined position, and an overlapping exposure technique is performed upon a positive or negative photosensitive material a predetermined number of times, once for each original, thereby forming a copy which approximates originally printed material, or within which the separate halftone film originals undergo overlapping exposure techniques with respect to a photosensitive material, or wherein the separate halftone film originals are layered or disposed in a tiered array so as to be multiply-exposed upon the photosensitive material.

Such color proof formation apparatus is effective in exposing both monochromatic and color photosensitive materials. In particular, the color proof formation apparatus is effective in forming a color proof which has the same colors as those of printed material, or the same can serve as a means for directly checking or confirming the presence or absence of an abnormality within a color separated halftone original, or still further, is effective within the film making process employed within the graphic arts and/or printing field which require multiple exposures. Still further, the color proof formation apparatus is effective as a poster formation apparatus for forming posters, using color photosensitive materials, from the color separated halftone originals.

DESCRIPTION OF THE PRIOR ART

Two types of exposure units are conventionally employed within color proof formation apparatus. Within one type of exposure unit, light from a light source is radiated upon an original so that the original is imaged upon a photosensitive material by means of a projection lens capable of imaging upon an enlarged scale, a reduced scale, or in scale which is neither enlarged or reduced. Within another type of exposure unit, light from a light source is radiated upon an original under such conditions wherein the original and photosensitive material are disposed in intimate contact with each other.

Within such exposure units, light from the light source is radiated either by means of scanning exposure or static exposure techniques. In accordance with the former exposure technique, a compact exposure unit can be achieved because the light source is comparatively small in size. In accordance with the latter exposure technique, however, a light source having a higher degree of luminance is employed, and the distance from the light source to the surface to be exposed is increased in order to obtain parallel and uniform lighting characteristics. Accordingly, the exposure unit tends to be bulky.

Within the printing process field, a large amount of film is used in the process of forming a printing plate, consisting of halftone images, from a continuous-tone image, such as, for example, a reversal film, or a color negative film or paper, thereby separating the colors and synthesizing an image. This process however entails work procedures which are quite complex whereby many failures, such as, for example, character and layout errors, occur. In addition, since a customer may order a change in the characters, layout, colors, or the like, in view of the fact that such occurs infrequently, an operator may tend to forget to incorporate such changes into the process. In addition, in order to determine whether or not a printed material has a desired color tone and/or gradation, the material must be pre-checked. These pre-checked items conventionally comprises the so-called or well-known "proofing" process.

In connection with the aforenoted "proofing" process, in addition to the production of a trial print called or known as a "proof", a variety of other proofing systems are now commercially available. Examples of such additional or alternative proofing systems are a CRT system; a system employing a nonsilver photosensitive material, such as, for example, a photopolymer or diazo; a system within which an image is formed by means of a dry toner; and an electrophotography system. All of these systems however require a long period of time in order to complete one color proof. In addition, the material cost is high, and the workability is poor. Consequently, such systems are not satisfactory in practical use.

Another method of forming a color proof comprises the printing of a separated halftone original upon a color photosensitive material by means of color-separated light. For example, Japanese unexamined Patent Publication (Kokai) No. 62-280746 discloses a method of obtaining a color proof upon a color photosensitive material by means of a photographing system which employs a projection lens. Although the apparatus for use in achieving such a process is substantially large in size, it is designed to satisfy the so-called "roomlight specifications" in accordance with which the operations or process can be performed within an ordinary room. More particularly, since the photosensitive material is maintained inside the apparatus, the exposure thereof need not be performed within a darkroom, but to the contrary, can be performed under normal room or interior illumination. Therefore, the color proofing can be easily performed within a short period of time, and at low cost, so as to realize results which are superior to those of other proofing systems. Since this method utilizes a photography system, however, the operation is adversely affected by means of, for example, flares or the like of a lens whereby the gradation reproducibility is degraded. More particularly, as a result of the flare or the like, the small-dot portion of the halftone is omitted, and the large-dot portions become continuous.

Another method of forming a color proof from a color photosensitive material is a contact exposure technique achieved by means of an enlarger unit, such as, for example, the CARLSON PROOFMASTER SYSTEM (Tradename) which is available from CHESLEY F. CARLSON COMPANY, or a COLOR PROOFING SYSTEM (Tradename) which is available from KREONIT, INC. Within these systems, a color separated halftone film original is brought directly into contact with and exposed upon a color photosensitive material. Therefore, the gradation reproducibility is largely improved as compared with that of the photography system. The aforenoted systems, however, cannot be operated under roomlight conditions because the color photosensitive material has a spectral sensitivity which is within the overall visible range. Therefore, an operator is required to perform the processing operation within a darkroom.

Within a conventional printer apparatus used in conducting a film making process, a transparent glass is located at a predetermined location upon a mounting table, a color separated halftone film original and a photosensitive material are placed upon the transparent glass so as to overlap each other, and an auxiliary member, such as, for example, a cover sheet, is placed thereon so as to cause any air interposed between the auxiliary member and the transparent glass to be removed through means of an exhaust groove formed within a predetermined neighboring portion of the mounting table, thereby performing exposure of the halftone film original and photosensitive material from the transparent glass side of the apparatus under the conditions wherein the original and photosensitive material are disposed in tight contact with respect to each other.

Within the film making process using the aforenoted type of printer apparatus having the above-identified exposure mechanism, tens of color separated halftone film originals are multiply-exposed upon one photosensitive material either singly, that is, one at a time, or alternatively, several originals simultaneously. In such a case, the photosensitive material must be removed from the apparatus each time an exposure is performed. Therefore, the operator must be especially attentive so as to perform the multiple exposures with a high degree of positional precision even though the apparatus also employs a positioning pin known as a pin bar.

In addition, the above-identified apparatus is not equipped with an integral air exhaustion device or mechanism, that is, an auxiliary cover means or sheet for exhausting the air interposed between the photosensitive material and the color separated halftone film original so as to in effect create a vacuum condition therebetween. As a result, partial floating of the original and photosensitive material, relative to each other, can easily occur so as to degrade the halftone reproducibility or color reproducibility.

In order to expose color separated halftone film originals upon a single photosensitive material, an apparatus preferably performs exposure with the film original and the photosensitive material in contact with each other so as to achieve satisfactory reproducibility of halftone, color tone, and/or halftone gradation.

The conventional color proof formation apparatus, or printed apparatus, for performing the exposure as described above performs dual overlapping exposure of the film originals upon a single photosensitive material as follows:

STEP ONE: A first film original is placed upon the transparent glass component, a photosensitive material is placed upon the first film original, and both the original and the photosensitive material are brought into tight contact with respect to each other so as to be subsequently exposed from the transparent glass side of the apparatus.

STEP TWO: In order to expose a second film original upon the same photosensitive material, the first film original and the photosensitive material are removed from their positions upon the transparent glass.

STEP THREE: The second film original is then placed upon the transparent glass, the photosensitive material used in the first step is placed upon the second film original, and both the second film original and photosensitive material are placed in intimate contact with each other so as to cause the exhaust of any air from therebetween and then subsequently exposed from the transparent glass side of the apparatus.

In order to perform such an overlapping plurality of times, STEPS ONE, TWO, and THREE are repeated.

In some cases, in order to perform an overlapping exposure a plurality of times, the photosensitive material must therefore be removed from the apparatus in order to replace the film originals and then replaced upon the transparent glass, such resulting in poor operability from an efficiency viewpoint.

In addition, the air exhaust groove defined within the neighboring portion of the mounting table sometimes becomes clogged with pieces or chips of the photosensitive material, or the like.

Still further, the above-type apparatus does not include a specific or integral air exhaustion device or mechanism for exhausting the air normally entrapped between the photosensitive material and the color separated halftone film originals so as to in effect create a vacuum condition therebetween. As a result, floating of the film originals and photosensitive material, relative to each other, can easily occur so as to degrade halftone reproducibility or color reproducibility.

Yet further, in order to perform overlapping exposures a plurality of times upon a photosensitive material, such as, for example, a color photosensitive material having a spectral sensitivity within the overall visible range, film originals must be replaced within a darkroom.

OBJECTS OF THE INVENTION

In order to resolve the problem of poor operability characteristic of the above-identified conventional contact-exposure apparatus, it is a first object of the present invention to provide a color proof formation method which can perform overlap exposure of a single photosensitive a plurality of times by only replacing film originals, and which can perform multiple exposures with high positioning precision.

It is a second object of the present invention to provide a color proof formation apparatus within which a suction or exhaust means can easily obtain or establish vacuum contact between the photosensitive material and the color separated halftone film originals.

It is a third object of the present invention to provide a color proof formation apparatus within which the suction or exhaust groove does not become clogged with dust or similar materials.

It is a fourth object of the present invention to provide a method and apparatus for forming a color proof, within which film originals can be replaced under roomlight conditions so as to perform overlap exposure a plurality of times upon a photosensitive material such as, for example, a color photosensitive material having a spectral sensitivity within the overall visible range.

BRIEF DESCRIPTION OF THE DRAWINGS

Various other objects features, and attendant advantages of the present invention will become better understood and appreciated from the following detailed description, when considered in conjunction with the accompanying drawings, in which like components are designated by similar reference characters throughout the several views, and wherein.

DETAILED DESCRIPTION OF THE PREFERRED EMBODIMENT

The present invention will now be described in detail with reference being made to the accompanying drawings.

A color proof formation apparatus constructed according to an embodiment of the present invention integrally comprises an exposure unit and an automatic developer, as will be described below, although it is to be understood that the present invention is not necessarily limited to the specific embodiment so described. In the following description, a color photosensitive material is used.

Figure 1:
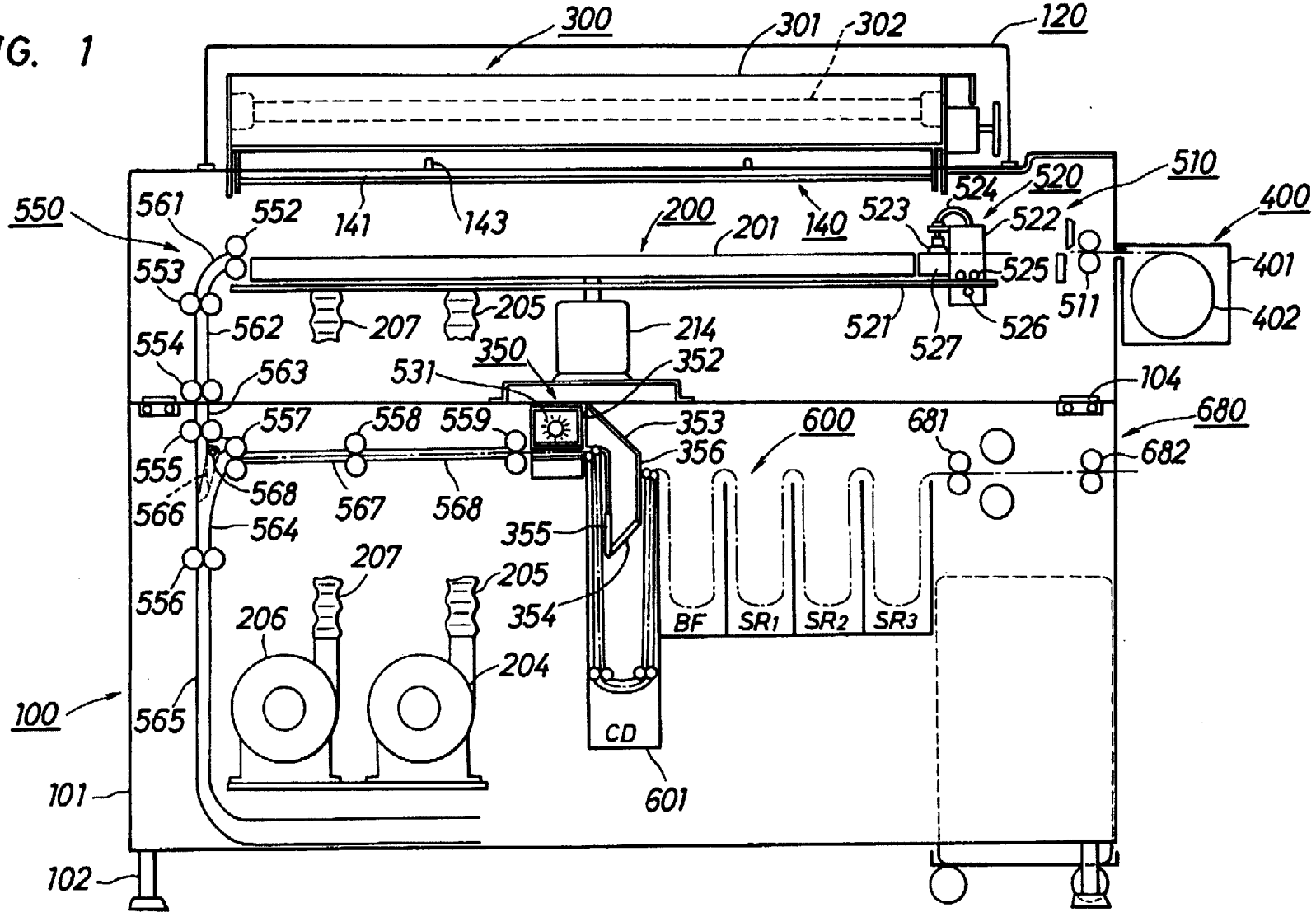
FIG. 1 is a front view showing a color proof formation apparatus according to the present invention wherein the same comprises an integral exposure unit and an automatic developer.
Figure 4:
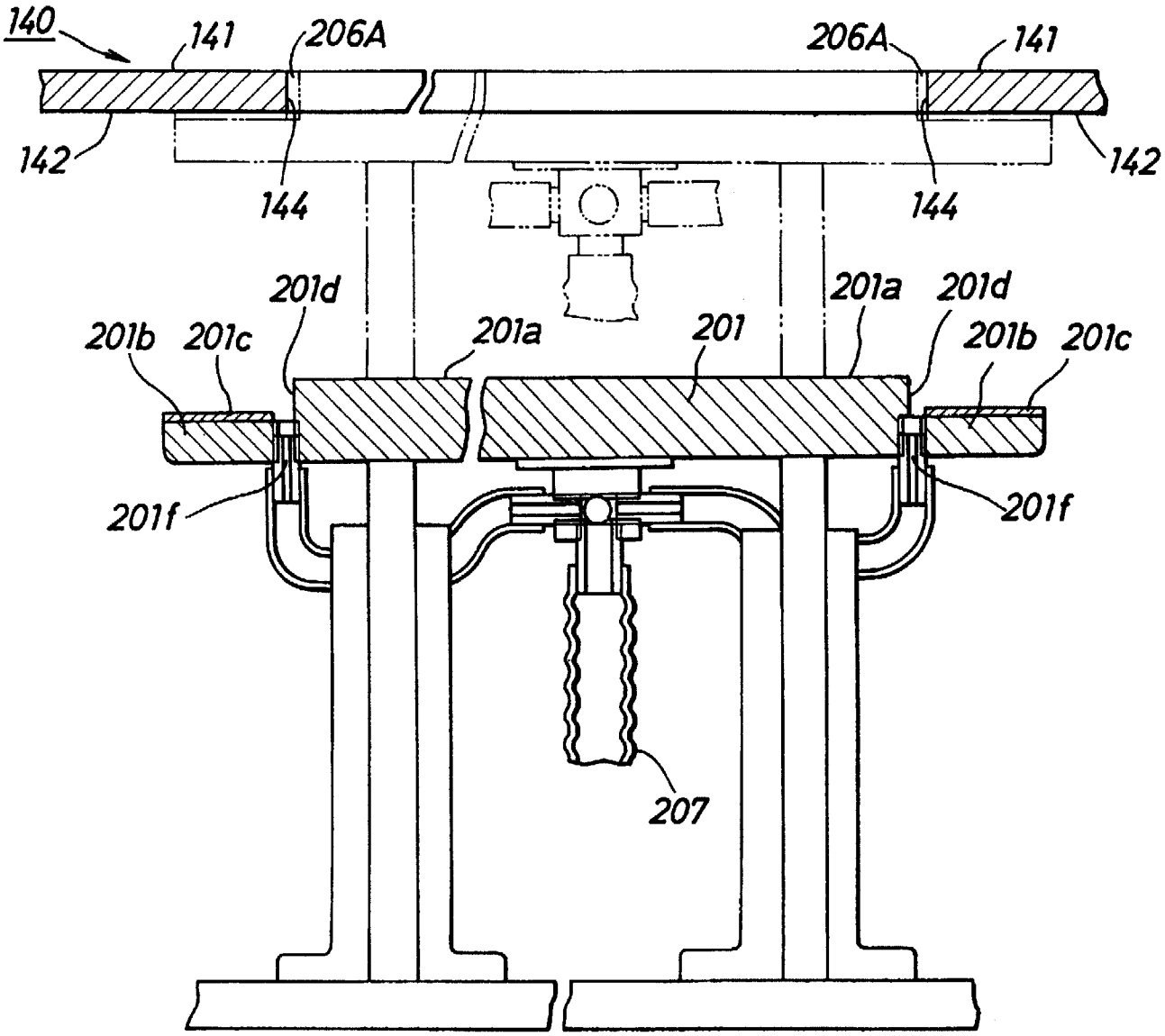
FIG. 4 is a side sectional view showing the positional relationship between the color separated halftone film original table and the photosensitive material mounting table.

Referring now to FIG. 1, a main body 100 of the color proof formation apparatus includes, at an upper portion of a main body frame 101 supported by means of legs 102, a film original mounting table 140 having an upper surface 141 from which film original positioning pin bars 143 extend upwardly, and a lower surface 142, as seen in FIG. 4. A light-shielding cover 120 is located above the film original table 140 so as to be opened and closed in order to, in effect, form a darkroom as a first room.

Figure 2:
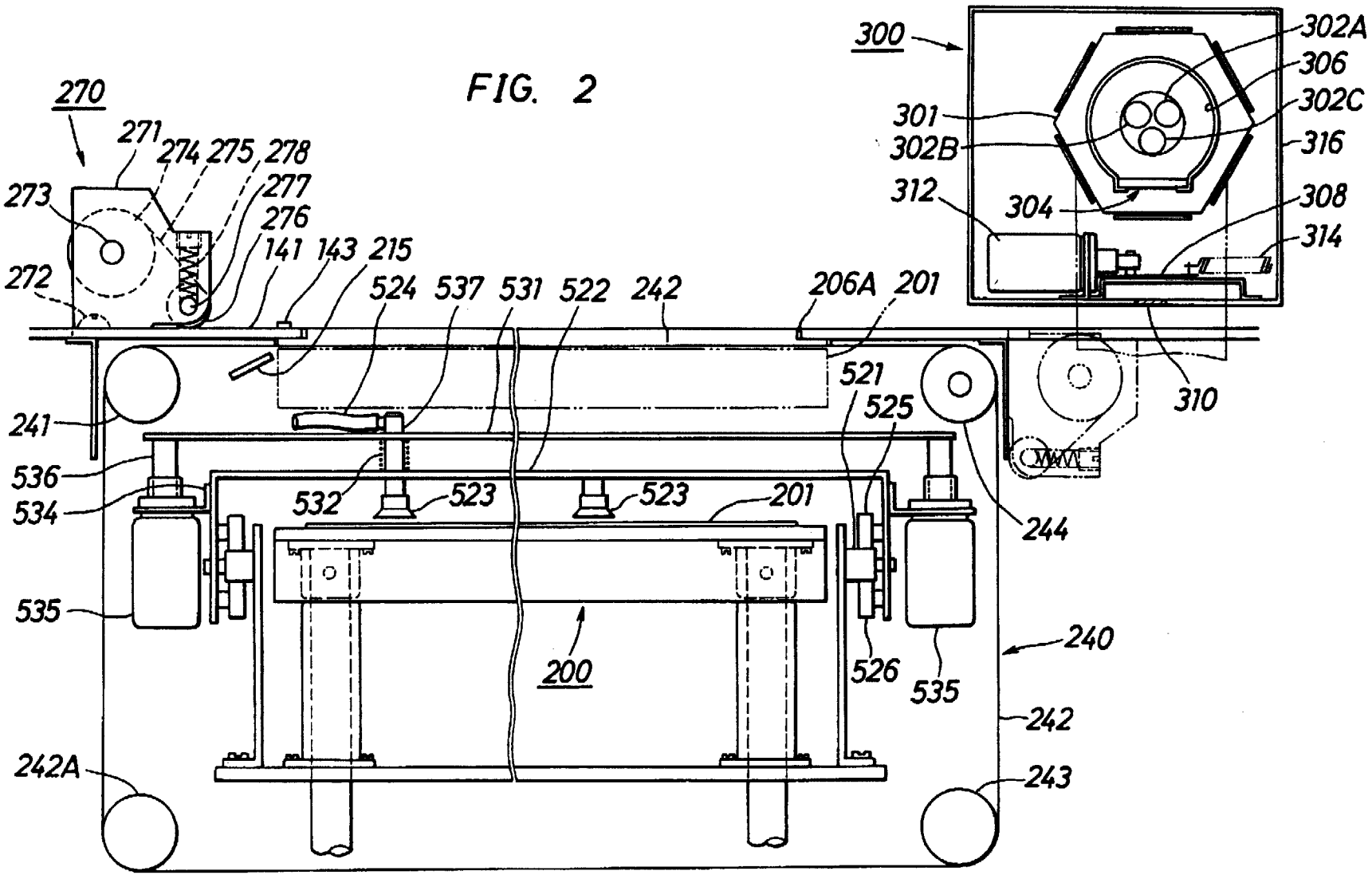
FIG. 2 is a side view of the color proof formation apparatus shown in FIG. 1.
Figure 3:
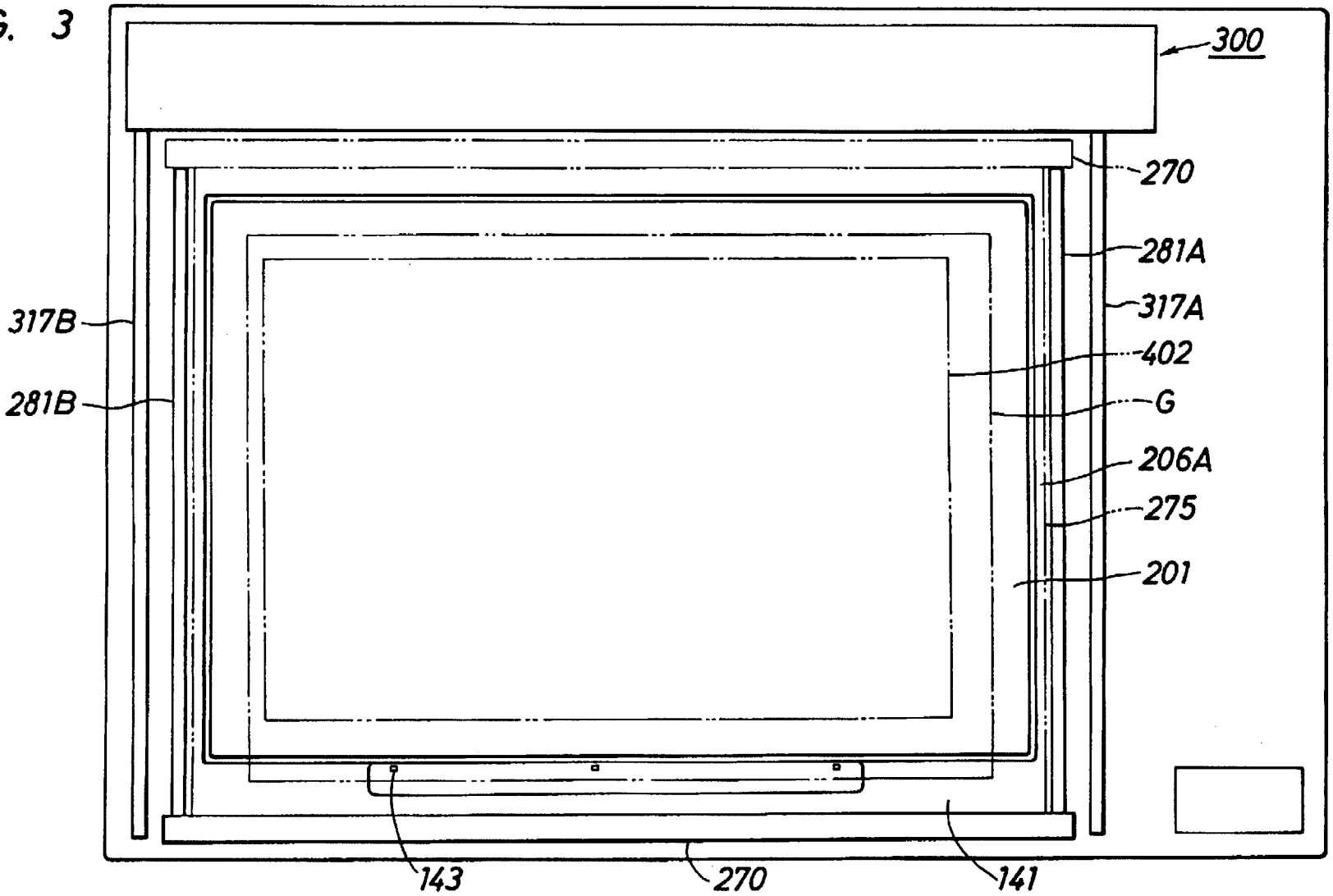
FIG. 3 is a plan view of the color proof formation apparatus shown in FIG. 1.

An exposure unit 300 is located within the first room so as to scan/expose the original. At the center of the exposure unit 300, a single light source, or a plurality of tubular light source lamps, for example, three lamps 302A, 302B, 302C, as best seen in FIG. 2, are disposed and surrounded by means of a drum-like reflecting mirror 306 which is fixed to a box member or housing 316 and which is also provided with a light-transmissive window 304. A polygonally-shaped cylinder 301 having filters of B, G, R, ND, and the like, disposed upon the respective surfaces thereof, is located externally of the drumlike reflecting mirror 306 and the light-transmissive window 304 so as to be able to rotate concentrically with respect to the center of the exposure unit 300 whereby a particular one of the filters and the transmission window 304 are always disposed toward or facing the contact-exposed original film surface. The box member or housing 316, having a shielding plate 308, a solenoid 312 for driving the shielding plate 308, a return spring 314, and an exposure window 310, is disposed in surrounding relationship about the polygonal cylinder 301. As shown in FIG. 3, the exposure unit 300 can move upon rails 317A and 317B so as to perform a scanning operation.

A photosensitive material mounting unit 200 is formed as a second chamber within the main body frame 101. A photosensitive material mounting table 201 is driven by means of a drive motor 214 so as to be vertically movable.

An endless, light-shielding curtain belt 242, which serves as a light-shielding member, is looped rollers 241, 242A, 243, and 244. One-half of the length of the belt 242 is formed so as to be a complete, light-shielding curtain, while an exposure window of a size greater than at least the cross-section of the moving range of the photosensitive material mounting table is formed within a substantially central portion of the remaining one-half of the belt 242. In connection with such a light-shielding member 240, the light-shielding curtain belt 242 is disposed at a level so as to be disposed slightly beneath the original table lower surface 142, that is interposed between the first and second chambers, thereby alternatively defining a light-shielded and unshielded state within the second chamber 200, within which the photosensitive material mounting table 201 is located, with respect to the first chamber.

Within this embodiment, the endless belt member is used as a light-shielding member, however, for the purpose of only shielding the photosensitive material from light, the light-shielding member need not be limited to the endless belt member but may be another type of member capable of shielding the second chamber from light.

A color photosensitive material roll 402 is loaded within a magazine 401 so as to form a photosensitive material loading unit 400 as best seen within the right side of FIG. 1. The leading end of the photosensitive material roll 402 is fed by means of a clamping roller pair 511 and is aligned with a cutter mechanism 510. The leading end of the roll material is fed further by means of the clamping roller pair 511 toward the left end of a fixing base 527 and is secured thereat by means of suction disks 523. A movable head 522 having the suctions disks 523 mounted thereon moves toward, and stops at, a position at which a predetermined length of the photosensitive material is measured, rollers 525 and 526, guided by means of rails 521 as best seen in FIG. 2 and disposed upon both sides of the movable head 522, serve to guide the movement of the head 522. The photosensitive material is then cut by means of the cutter mechanism 510 and is then moved so that the leading end thereof is located at a predetermined position with respect to the photosensitive material mounting table 201. After the suction force for the suction disks 523 of the movable head 522 is switched off, the movable head 522 returns to its original position.

Solenoids 535 are mounted upon both sides of the movable head 522 through means of brackets 534 as best seen in FIG. 2. A frame 531 is fixed to movable iron cores 536 of the solenoids 535. A holding pipe 537 is fixed to the frame 531 through means of a guide hole formed within the movable head 522, while the suction disks 523 are fixed upon the distal ends, that is, the lower ends, of the holding pipes 537, a hose 524 being connected to the upper end of each holding pipe 537. The holding pipes 537 can slide along the guide holes, and the frame 531 is biased so as to be separated from the movable head 522 by means of helical springs 532 interposed between the frame 531 and the movable head 522. Therefore, the suction disks 523 are separated from the photosensitive material mounting table 201. When the solenoids are energized and a suction valve (not shown) is opened, the suction disks 523 are moved downwardly so as to attract the photosensitive material 402 by means of the suction forces. Thereafter, when the solenoids 535 are deenergized, the suction disks 523 are moved upwardly so as to be able to convey the photosensitive material 402.

In this manner, the photosensitive material 402 is conveyed toward and deposited upon the photosensitive material mounting table 201. The photosensitive material 402 is similarly attracted by suction forces so as to be fixed upon the photosensitive material mounting table 201 by means of suction pressure applied thereto by means of a suction hole formed within the photosensitive material mounting table 201 and a flexible hose 205 when a vacuum pump 204 is actuated. The photosensitive material is maintained fixed upon the mounting table 201 until the exposure of the same, the predetermined number of times, is completed whereby conveyance of the photosensitive material to a developing unit may then be performed.

In this state, since the light-shielding curtain belt 242 is located at the light-shielding position, a darkroom is in effect formed within the second chamber within which the photosensitive material mounting table 201 is located.

The light-shielding cover 120 is subsequently opened so as to permit external light to enter into the first chamber. In this state, reference holes of a color separated halftone film original G, as seen in FIG. 3, or at least one of the color separated film originals, for example, the yellow separated film original, is fitted upon the registry pins or pin bars 143 which extend upwardly from the upper surface 141 of the table 140 such that most of the film original is disposed upon the light-shielding curtain.

The light-shielding cover 120 is then closed so that the first chamber becomes a darkroom and is maintained shielded from light. After the photosensitive material mounting table 201 is moved upwardly to a position just below the surface of the light-shielding curtain belt 242, the latter is moved so as to eliminate the light-shielded state. While the first chamber within which the upper surface of the original mounting table 140 is located, and the second chamber within which the photosensitive material mounting table 201 is located, form a common dark room, the photosensitive material mounting table 201 is moved upwardly to the same level as that of the exposure surface, that is, the original reference surface. At this time, an airtight packing 201c, as best seen in FIG. 4, disposed upon an upper support surface surrounding the photosensitive material mounting table 201 and within the second chamber is brought into contact with the lower surface 142 of the original mounting table 140 disposed within the first chamber, and a gap, defined between a portion of the photosensitive material mounting table 201 which is to be fitted within an open portion of the original mounting table 140, and the sidewalls of the open portion of the original mounting table 140, forms a suction groove 206A as shown in FIG. 2. In addition, that portion defined between the original and the photosensitive material held between the original mounting table surface and the photosensitive material mounting table surface by means of a transparent member, is maintained airtight.

In this embodiment, the cover sheet is used as the transparent member, however, glass, for example, can be used as long as the suction property or the like is not degraded.

A transparent cover sheet 275 is wound around a shaft 273 so as to form a cover sheet roll 274 as best seen in FIGURE 2. The leading end of the cover sheet roll 274 is fed by means of a squeeze roller 276 and is fixed by means of a fixing member 272 within a cover sheet holding unit 270. A head 271 of the cover sheet holding unit 270 is guided by means of rails 281A and 281B, as best seen in FIG. 3, so as to be movable toward the right as seen in FIG. 2. As a result, the transparent cover sheet 275 is fed from the cover sheet roll 274 and is biased by means of a spring 278. The transparent cover sheet 275 is thus squeezed by means of the squeeze roller 276 rotatably supported by means of a shaft 277 so as to cover the original and the photosensitive material. When the head 21 reaches the right end of its travel, a vacuum pump 206 which serves as a pressure reducing device, operates so as to attract the transparent cover sheet 275 away from the groove 206A. More particularly, a suction or vacuum path for sucking the air from between the transparent cover sheet, the film original, and the photosensitive material, is established through means of a suction hose 207 which is connected to a suction hole 201f formed within the photosensitive material mounting table 201. As a result, the air interposed between the exposure table, the upper surface portion, and the transparent cover sheet is evacuated so that the photosensitive material, the original, and the transparent cover sheet are overlapped and brought into tight surface contact with each other. That is, the transparent cover sheet is used as an auxiliary suction member for evacuating the air from between the film original and the photosensitive material so that the film original and the photosensitive material are brought into tight contact with respect to each other. In addition, the suction groove is located close to the pin bar and beneath the film original so that it can easily obtain the vacuum contact between the photosensitive material and the color separated film original. Squeezing of the transparent cover sheet, positioning of the film original mounting table 140 and the photosensitive material mounting table 201, and the suction are preferably performed in the above order, however, they need not be necessarily performed in the above order.

As shown in FIG. 4, in order to bring the film original and the photosensitive material into tight contact with respect to each other, a dimensional relationship between the abutting surface 201b, the airtight packing 201c mounted thereon, and the lower surface 142 of the original mounting table 140 is adjusted so that the upper surface 141 of the original mounting table 140 and the upper surface 201a of the photosensitive material mounting table 201 are preferably set at the same level. In this manner, the air interposed between the original mounting table and the photosensitive material mounting table is smoothly evacuated from the groove, and the transparent cover sheet, the original, and the photosensitive material mounting table are brought into tight surface contact with respect to each other. Alternatively, the photosensitive material mounting table may be disposed at a position which is slightly lower or higher than that of the original table.

Within the contact-exposure unit of the color proof formation apparatus within which the film original mounting table or the photosensitive material mounting table is moved, the following two arrangements can be adopted so as to form the suction groove within the film original mounting table or the photosensitive material mounting table. That is, in accordance with the first arrangement, the suction groove is formed between a positioning means for the film original and the photosensitive material. In accordance with the second arrangement, the suction groove is formed outside the film original positioning means with respect to the photosensitive material.

In accordance with the first arrangement, however, a wall must be formed between the film original positioning means and the photosensitive material so as to form the suction groove. As a result, since the distance between the film original positioning means and the photosensitive material is increased, patterns upon the film original closer to the film original positioning means are sometimes not printed upon the photosensitive material.

In accordance with the second arrangement, the film original positioning means interferes with the suction forces. Therefore, it is difficult to evacuate or suck the air away from the center region of the film original.

In accordance with this arrangement, the suction groove is formed between the film original and the photosensitive material mounting table. Therefore, the air disposed within or at the central region of the film original can be easily evacuated within a relatively short period of time. In addition, although the suction groove is formed between the photosensitive material and the film original, the film original positioning means and the photosensitive material can be located close to each other because there is no provision of any groove or wall present therebetween. As a result, even patterns upon the film original which are located close to the film original positioning means can in fact be printed.

Within the suction contact-exposure state, the exposure unit 300 is movable upon the guide rails 317A and 317B so as to perform the scanning exposure operation, thereby completing the first color exposure by means of a filter.

For achieving a second image exposure by means of a filter of another color, the transparent cover sheet is returned to its original position, and the photosensitive material mounting table 201 is moved downwardly to a position slightly lower than the running path of the light-shielding curtain belt. Air is supplied by means of a nozzle 215, as seen in FIG. 2, or alternatively, the blowing side of the vacuum pump 206 is utilized to supply air into the suction groove 206A so as to further close the light-shielding curtain belt. As a result, the original and photosensitive material are easily and completely separated from each other. It is to be noted that the supply of the air to the suction groove 206A by means of the vacuum pump, and the downward movement of the photosensitive material mounting table, may be performed in a reverse order or at the same time. When the light-shielding cover 120 is opened, the first chamber is exposed to room-light, however, the second chamber is still shielded from light with respect to the first chamber, that is, a darkroom is still formed therein. In this state, the color separated halftone film original G, that is, at least one of the color separated film originals, for example, the magenta separated film original, is disposed upon the registry pins within the second chamber. After the light-shielding cover 120 is closed, the light-shielding curtain belt is opened, and the photosensitive material mounting table 201 is moved upwardly to the same level as that of the original mounting table 140. The transparent cover sheet is then moved to its covered position and suction applied thereto so as to bring the respective sheets into tight contact with respect to each other. Thereafter, the polygonal cylinder 301 is rotated so as to bring a new cylindrical surface, having the new filter disposed thereon, into the predetermined position whereby the scanning exposure operation by means of the second color filter can be performed.

Similarly, the third color separated halftone film original G, that is, at least one of the color separated film originals, for example, the cyan separated film original, and a corresponding filter are used to perform a scanning exposure operation in the same manner, thereby completing a third exposure.

In this manner, scanning exposure operations are repeatedly performed one or several times, as necessary.

Within the conventional contact apparatus, the photosensitive material is removed together with the film original from the contact apparatus each time an exposure is performed. Therefore, the photosensitive material cannot be stably positioned relative to each exposure operation. With the embodiment of the present invention, however, the photosensitive material is fixed upon the photosensitive material mounting table 201 by means of the suction forces, and the photosensitive material mounting table 201 and the film original mounting table 140 are separated from each other as shown in FIG. 4. Therefore, since the photosensitive material is not removed from the photosensitive material mounting table 201 during replacement or exchange of the film originals, the photosensitive material can be positioned with a high degree of precision or accuracy.

In addition, within the conventional color proof formation apparatus, that is, contact-exposure apparatus, a photosensitive material can be handled together with the film original under room-light conditions if the photosensitive material is of the type which does not become exposed under roomlight conditions. Therefore, within the conventional contact-exposure apparatus, in order to perform overlapping exposure processing a plurality of times using a panchromatic photosensitive material, the latter must be carefully handled so as not to be exposed to light. In the embodiment of the present invention, however, the photosensitive material is maintained within a darkroom by means of the light-shielding member 240 when contact exposure is not performed, that is, the photosensitive material mounting table 201 and the film original mounting table 140 are separated from each other. Therefore, overlapping exposures can be performed a plurality of times using a panchromatic photosensitive material under room light conditions in view of the fact that only the film original is replaced or exchanged.

As described above, after overlapping exposures are performed upon the single photosensitive material a plurality of times, the photosensitive material mounting table 201 is then moved downwardly to its lower limit, and the suction force is discontinued so as to release or eliminate the contact state of the photosensitive material. Thereafter, the leading end of the photosensitive material is fed to clamping rollers 552 by means of suction disks 523 or other conventional means.

The photosensitive material, the leading end of which has reached the clamping rollers 552, is then fed downwardly by means of guides 561, 562, 563, 564, 565, a switching chute 566, and guide rollers 552, 553, 554, 555, 556, of a conveying chute unit 550 which is best illustrated in FIG. 1. Thereafter, by switching a pivoting support shaft 568 of the switching chute 566, the photosensitive material is conveyed by means of its trailing end between guides 564, 566, 567, 568 to a processing unit 600 by means of rollers 556, 557, 558, 559.

If a post-exposure type internal latent image direct positive photosensitive material is being used, post-exposure is performed by means of an exposure lamp 531, a filter device 352, and an exposure box or housing 356 comprising reflecting plates 353 and 354, and an exposure window 355 disposed within a second exposure unit 350 while or as the photosensitive material is being conveyed within a color development tank 601. The photosensitive material is processed within a bleach-fixing tank and a stabilizing tank, and is then slowly conveyed and dried within a drying unit 680 by means of rollers 681 and 682. The processed photosensitive material is then obtained from the right end side of the apparatus.

When conveyance of the exposed photosensitive material is started within the conveyor chute unit 550, the following or trailing photosensitive material is accordingly conveyed onto the photosensitive material mounting table 201. Such following or trailing photosensitive material is measured, cut by means of the cutter 510, and deposited within the contact state as described above.

When the post exposure type internal latent image direct positive photosensitive material is to be used as the photosensitive material, a second exposure must be performed. However, when a negative color photosensitive material or a solarization type photosensitive material and e.t.c. is to be used, a second exposure light source is maintained OFF because the second exposure need not be performed.

In addition, a photosensitive material of another type, such as, for example, a dye-bleaching color photosensitive material, or a color-reversal or diffusion-transfer type photosensitive material can be similarly processed by means of the above-described system using a processing bath corresponding to the photosensitive material.

The direct positive photosensitive material is exposed as follows, that is, a black separated film original is overlapped upon each one of yellow color separated film originals of yellow, magenta, and cyan, and filters of blue, green, and red are used in correspondence with the yellow and black originals, the magenta and black originals, and the cyan and black originals, respectively, thereby performing the suitable exposures, three times. As a result, a color proof is formed.

The negative color photosensitive material can be exposed as follows, that is, color separated film originals of yellow, magenta, and cyan are overlapped upon the photosensitive material, one at a time, and filters of blue, green, and red are used in correspondence with the yellow, magenta, and cyan originals, respectively, thereby performing an exposure three times. Thereafter, a black separated film original is overlapped, and a fourth exposure is performed using an ND filter or a color filter for correcting colors, or a triple exposure of blue, green, and red is performed.

If necessary, light corresponding to different color separation may be used in addition tO the above types of color separation exposure so as to perform another exposure, thereby obtaining a basic color suitable for a printing ink. In addition, in order to blend the light corresponding to different color separation, luminescent colors of blue, green, and red may be blended, or an exposure may be performed using filters in combination.

Similarly, in order to reproduce a so-called "special color" suitable for a special ink other than standards inks of yellow, magenta, cyan and black separated film originals, exposure may be repeatedly performed, the luminescent colors may be blended, or filters may be used in combination. In this case, the special color can be reproduced by performing an exposure using a color separated film original called a special color separated film original, using a combination of the color separated film originals called a special color separated film original and another color separated film original, or using a plurality of overlapped color separated film originals, if necessary.

In the above apparatus, the exposed photosensitive material is fed into the guide chute 565, reversed therein, and then supplied to the developing unit with its emulsion surface facing upwardly. The photosensitive material, however, need not be fed into the guide chute but may be turned and fed directly toward the developing unit. When the post exposure type internal latent image direct positive photosensitive material is to be used as a photosensitive material, however, the second exposure light source must be located above the developing unit and below the photosensitive material conveyor path. Therefore, it is difficult to mount the light source at its desired position, or to perform maintenance thereon, and therefore, an exposure window must be defined within the side surface of the developing tank. This is not in fact preferred because cleaning of liquid leakage or the like becomes difficult.

A photosensitive material comprises two types, that is, high and low-sensitivity types. When the low-sensitivity type of photosensitive material is to be used, a plurality of light source lamps 302 may be illuminated within the polygonal cylinder 301 within the exposure unit 300 so as to increase the intensity of the exposure light.

By performing an operation of reducing the scanning rate, and an operation of varying the opening ratio of the exposure window 310 either singly or in combination, exposure can be performed with a high degree of quality by properly satisfying contrary conditions.

Although a full-color photosensitive material is used within the above-described embodiment, the photosensitive material is not so limited. In addition, the color proof formation apparatus of the present invention may be an apparatus serving as only an exposure type apparatus.

According to the present invention, in the contact-exposure apparatus within which exposure is performed from a film original side, overlapping exposure can be performed a plurality of times upon a single photosensitive material by only replacing placing a film original without removing the photosensitive material from the contact-exposure apparatus, thereby improving the operability thereof. In addition, the positional precision of the photosensitive material is effectively improved.

Still further, according to the present invention, the suction groove is formed upon contact exposure between the film original mounting table and the photosensitive material mounting table so as to bring a film original and a photosensitive material into tight contact with respect to each other. Therefore, since no suction groove is present within the contact-exposure apparatus of the present invention when an exposure is not being performed, the suction groove does not tend to become suffed or clogged with dust, chips of material or the like. Furthermore, no suction groove is formed within the film mounting table and the photosensitive material mounting table, while air disposed at the center of the film original can be easily evacuated, and patterns upon the film original close to the film original positioning means can be printed upon the photosensitive material. Therefore, formation of the film mounting table and the photosensitive material mounting table can be easily performed.

In addition, according to the present invention, the suction groove is defined or located close to the pin bars beneath the film original so that it can easily obtain vacuum contact between the photosensitive material and the color separated film original.

Moreover, according to the present invention, when exposure is not being performed, that is, when the photosensitive material mounting table is separated from the film original mounting table, the photosensitive material is maintained within a darkroom environment. Therefore, overlapped exposure of a panchromatic photosensitive material can be performed a plurality of times by replacing only a film original.

Obviously, many modifications and variations of the present invention are possible in light of the above teachings. It is therefore to be understood that within the scope of the appended claims, the present invention may be practiced otherwise than as specifically described herein.

What is claimed is:

1. A color proof formation method, comprising the steps of:

placing a first original film at a predetermined position upon an original mounting table;

fixing a color photosensitive material at a predetermined position upon a color photosensitive material mounting table, which is separate from, disposed beneath, and independently movable with respect to said original mounting table in a vertical mode between an upper position and a lower position, when said color photosensitive material mounting table is disposed at said lower position such that said color photosensitive material is substantially vertically aligned with said first original film disposed upon said original mounting table;

elevating said color photosensitive material mounting table from said lower position to said upper position such that said color photosensitive material fixed upon said color photosensitive material mounting table is disposed in tight contact with said first original film disposed upon said original mounting table;

exposing said color photosensitive material through said first original film by means of a light source;

lowering said color photosensitive material mounting table from said upper position to said lower position so as to separate said color photosensitive material mounting table, with said color photosensitive material fixed thereon, from said original mounting table with said first original film disposed thereon;

replacing said first original film disposed upon said original table with a second original film while said color photosensitive material is retained at said predetermined position upon said color photosensitive material mounting table; and repeating said steps of elevating said color photosensitive material mounting table, exposing said color photosensitive material, lowering said color photosensitive material mounting table, and replacing a predetermined original film with a successive original film a predetermined number of times so as to form a color proof.

2. A method according to claim 1, wherein the photosensitive material and the film original are brought into tight contact with each other by suction.

3. A [method according to claim 1, wherein:] *color proof formation method, comprising the steps of:*

*placing a first original film at a predetermined position upon an original mounting table:*

*fixing a color photosensitive material at a predetermined position upon a color photosensitive material mounting table, which is separate from, disposed beneath, and independently movable with respect to said original mounting table in a vertical mode between an upper position and a lower position, when said color photosensitive material mounting table is disposed at said lower position such that said color photosensitive material is substantially vertically aligned with said first original film disposed upon said original mounting table;*

*elevating said color photosensitive material mounting table from said lower position to said upper position such that said color photosensitive material fixed upon said color photosensitive material mounting table is disposed in tight contact with said first original film disposed upon said original mounting table;*

*exposing said color photosensitive material through said first original film by means of a light source;*

*lowering said color photosensitive material mounting table from said upper position to said lower position so as to separate said color photosensitive material mounting table, with said color photosensitive material fixed thereon, from said original mounting table with said first original film disposed thereon;*

*replacing said first original film disposed upon said original table with a second original film while said color photosensitive material is retained at said predetermined position upon said color photosensitive material mounting table;*

*wherein* a halftone original is inserted between one of said original films and said color photosensitive material during exposure*; and*

*repeating said steps of elevating said color photosensitive material mounting table, exposing said color photosensitive material, lowering said color photosensitive material mounting table, and replacing a predetermined original film with a successive original film a predetermined number of times so as to form a color proof.*

4. A [method according to claim 1, wherein when said mounting table and said original table are separated from each other,] *color proof formation method, comprising the steps of:*

*placing a first original film at a predetermined position upon an original mounting table:*

*fixing a color photosensitive material at a predetermined position upon a color photosensitive material mounting table, which is separate from, disposed beneath, and independently movable with respect to said original mounting table in a vertical mode between an upper position and a lower position, when said color photosensitive material mounting table is disposed at said lower position such that said color photosensitive material is substantially vertically aligned with said first original film disposed upon said original mounting table;*

*elevating said color photosensitive material mounting table from said lower position to said upper position such that said color photosensitive material fixed upon said color photosensitive material mounting table is disposed in tight contact with said first original film disposed upon said original mounting table;*

*exposing said color photosensitive material through said first original film by means of a light source;*

*lowering said color photosensitive material mounting table from said upper position to said lower position so as to separate said color photosensitive material mounting table, with said color photosensitive material fixed thereon, from said original mounting table with said first original film disposed thereon and shielding the light sensitive material from light using* a light-shielding member [shields the photosensitive material from light]*;*

*replacing said first original film disposed upon said original table with a second original film while said color photosensitive material is retained at said predetermined position upon said color photosensitive material mounting table; and*

*repeating said steps of elevating said color photosensitive material mounting table, exposing said color photosensitive material, lowering said color photosensitive material mounting table, and replacing a predetermined original film with a successive original film a predetermined number of times so as to form a color proof.*

5. A [method according to claim 1, wherein:] *color proof formation method, comprising the steps of:*

*placing a first original film at a predetermined position upon an original mounting table:*

*fixing a color photosensitive material at a predetermined position upon a color photosensitive material mounting table, which is separate from, disposed beneath, and independently movable with respect to said original mounting table in a vertical mode between an upper position and a lower position, when said color photosensitive material mounting table is disposed at said lower position such that said color photosensitive material is substantially vertically aligned with said first original film disposed upon said original mounting table;*

*elevating said color photosensitive material mounting table from said lower position to said upper position such that said color photosensitive material fixed upon said color photosensitive material mounting table is disposed in tight contact with said first original film disposed upon said original mounting table;*

*exposing said color photosensitive material through said first original film by means of a light source;*

*lowering said color photosensitive material mounting table from said upper position to said lower position so as to separate said color photosensitive material mounting table, with said color photosensitive material fixed thereon, from said original mounting table with said first original film disposed thereon;*

*replacing said first original film disposed upon said original table with a second original film while said color photosensitive material is retained at said predetermined position upon said color photosensitive material mounting table;*

*wherein* one of said original films is covered by means of a transparent material during exposure; *and*

*repeating said steps of elevating said color photosensitive material mounting table, exposing said color photosensitive material, lowering said color photosensitive material mounting table, and replacing a predetermined original film with a successive original film a predetermined number of times so as to form a color proof.*

*6. A color proof formation method, comprising the steps of:*

*(i) fixing a color photosensitive material at a first predetermined position on a color photosensitive material mounting table by a first sucking means;*

*(ii) placing a first original film at a second predetermined position on the color photosensitive material so as to bring the original film into contact with the color photosensitive material;*

*(iii) covering the original film and the color photosensitive material with a light-transmittable cover sheet;*

*(iv) fixing the cover sheet by a second sucking means so that the original film and the color photosensitive material are brought into tight contact;*

*(v) exposing the color photosensitive material through the cover sheet for printing the original film on the color photosensitive material;*

*(vi) replacing the first original film with a second original film;*

*(vii) repeating said steps of placing the original film, covering with the cover sheet, fixing the cover sheet, exposing the color photosensitive material, and replacing the original film with a successive original film a predetermined number of times so as to form a color proof, while the color photosensitive material is retained at the first predetermined position on said color photosensitive material mounting table by the first sucking means.*

*7. The method of claim 6, wherein the first and the second sucking means can be independently controlled.*

*8. In the method of claim 6, further comprising the step of determining the predetermined position of the original film by a position determining means before the step of placing the original film on the photosensitive material.*

*9. The method of claim 8, wherein the position determining means is a position pin bar.*

*10. The method of claim 8, wherein the position determining means is operated under roomlight conditions during the steps of fixing a color photosensitive material and replacing the original film.*

*11. In the method of claim 6, between the exposing and replacing steps, further comprising the step of moving the color photosensitive material mounting table with the color photosensitive material away from the original film so as to separate the original film from the color photosensitive material.*

*12. The method of claim 6, wherein the color photosensitive material mounting table is movable between an upper position and a lower position in a vertical direction.*

*13. In the method of claim 12, after the step of fixing the color photosensitive material, further comprising moving the color photosensitive material mounting tables to the upper position so as to contact the original film.*

*14. In the method of claim 12, between the exposing and replacing steps, further comprising moving the color photosensitive material mounting table to the lower position so as to separate the photosensitive material from the first original film.*

*15. The method of claim 14, wherein, after the color photosensitive material and the original film are separated from each other, a light-shielding member shields the color photosensitive material from light.*

*16. The method of claim 6, wherein the first sucking means and the second sucking means use a vacuum pump.*

*17. In the method of claim 6, before the exposing step, further comprising inserting a halftone original between one of the original films and the color photosensitive material.*

*18. The method of claim 3, wherein the photosensitive material and the original film are brought into tight contact with each other by suction.*

*19. The method of claim 4, wherein the photosensitive material and the original film are brought into tight contact with each other by suction.*

*20. The method of claim 5, wherein the photosensitive material and the original film are brought into tight contact with each other by suction.*

* * * * *